United States Patent
Schnell et al.

(10) Patent No.: US 7,014,923 B2
(45) Date of Patent: Mar. 21, 2006

(54) METHOD OF GROWING A MCRALY-COATING AND AN ARTICLE COATED WITH THE MCRALY-COATING

(75) Inventors: Alexander Schnell, Ennetbaden (CH); Cyrille Bezencon, Chermignon (CH); Matthias Hoebel, Windisch (CH); Abdus Suttar Khan, Baden (CH); Maxim Konter, Klingnau (CH); Wilfried Kurz, La Conversion (CH)

(73) Assignee: Alstom Technology LTD, Baden (CH)

( * ) Notice: Subject to any disclaimer, the term of this patent is extended or adjusted under 35 U.S.C. 154(b) by 0 days.

(21) Appl. No.: 10/490,337

(22) PCT Filed: Sep. 6, 2002

(86) PCT No.: PCT/IB02/03595

§ 371 (c)(1),
(2), (4) Date: Mar. 22, 2004

(87) PCT Pub. No.: WO03/035946

PCT Pub. Date: May 1, 2003

(65) Prior Publication Data

US 2004/0244676 A1 Dec. 9, 2004

(30) Foreign Application Priority Data

Sep. 22, 2001 (EP) ................... 01122818

(51) Int. Cl.
*B32B 15/01* (2006.01)
*B05D 3/00* (2006.01)

(52) U.S. Cl. ............ 428/668; 428/615; 428/679; 428/680; 428/926; 428/939; 427/554

(58) Field of Classification Search ........... 428/668, 428/615, 679, 680, 926, 939; 427/431, 436, 427/554
See application file for complete search history.

(56) References Cited

U.S. PATENT DOCUMENTS

| | | |
|---|---|---|
| 3,528,861 A | 9/1970 | Elam et al. |
| 3,676,085 A | 7/1972 | Evans et al. |
| 3,754,903 A | 8/1973 | Goward et al. |
| 4,152,223 A | 5/1979 | Wallace et al. |
| 4,313,760 A | 2/1982 | Dardi et al. |
| 4,346,137 A | 8/1982 | Hecht |
| 4,419,416 A | 12/1983 | Gupta et al. |
| RE32,121 E | 4/1986 | Gupta et al. |
| 4,585,481 A | 4/1986 | Gupta et al. |
| 4,643,782 A | 2/1987 | Harris et al. |
| 4,743,514 A | 5/1988 | Strangman et al. |

(Continued)

FOREIGN PATENT DOCUMENTS

| | | |
|---|---|---|
| EP | 0740977 A1 | 11/1996 |
| EP | 1001055 A1 | 5/2000 |

*Primary Examiner*—Robert R. Koehler
(74) *Attorney, Agent, or Firm*—Buchanan Ingersoll PC

(57) ABSTRACT

A gas turbine component consists of a superalloy base material with a single crystal structure and a protective MCrAlY-coating. The MCrAlY-coating the MCrAlY has a $\gamma/\beta$-phase and single crystal structure, which is epitaxial with the base material.

16 Claims, 2 Drawing Sheets

U.S. PATENT DOCUMENTS

| | | |
|---|---|---|
| 4,758,480 A | 7/1988 | Hecht et al. |
| 4,973,445 A | 11/1990 | Singheiser |
| 5,232,789 A | 8/1993 | Platz et al. |
| 5,304,039 A * | 4/1994 | Corderman et al. ........ 428/680 |
| 5,312,584 A | 5/1994 | Frasier et al. |
| 5,759,301 A | 6/1998 | Konter et al. |
| 5,888,451 A | 3/1999 | Konter et al. |
| 5,993,980 A | 11/1999 | Schmitz et al. |
| 6,024,792 A | 2/2000 | Kurz et al. |

* cited by examiner

METHOD OF GROWING A MCRALY-COATING AND AN ARTICLE COATED WITH THE MCRALY-COATING

FIELD OF INVENTION

The invention relates to a method of epitaxially growing a MCrAlY-coating and to an article coated with the MCrAlY-coating.

STATE OF THE ART

Components designed for the use in the area of high temperature, e.g. blades or vanes of a gas turbine, are usually coated with resistant coatings. The coating protects the base material against corrosion and oxidation due to the thermal effect of the hot environment and consists of an alloy mostly using the elements Al and Cr. Most turbine components are coated for the protection from oxidation and/or corrosion with, for example, a MCrAlY coating (base coat) and some are also coated with a thermal barrier coating (TBC) for thermal insulation. MCrAlY protective overlay coatings are widely known in the prior art. They are a family 6f high temperature coatings, wherein M is selected from one or a combination of iron, nickel and cobalt. As an example U.S. Pat. No. 3,528,861 or U.S. Pat. No. 4,585,481 are disclosing such kind of oxidation resistant coatings. U.S. Pat. No. 4,152,223 as well discloses such method of coating and the coating itself. Besides the $\gamma/\beta$-MCrAlY-coating, there is another class of overlay MCrAlY coatings which are based on a $\gamma/\gamma'$-gamma/gamma prime-structure. The advantages of $\gamma/\gamma'$-coatings is that they have a negligible thermal expansion mismatch with alloy of the underlying turbine article. For higher thermal fatigue resistance the $\gamma/\gamma'$-coating are more convenient compared to the $\gamma/\beta$-type of MCrAlY-coatings. A higher thermal fatigue resistance in coatings is most desirable since failure of the most turbine blades and vanes at elevated temperature is typically thermal fatigue driven.

Among $\gamma/\gamma'$-coatings and $\gamma/\beta$-coatings, the field of $\gamma/\beta$-coatings have been an active area of research and a series of patents has been issued. E.g. a Ni—CrAlY coating is described in U.S. Pat. No. 3,754,903 and a CoCrAlY coating in U.S. Pat. No. 3,676,058. U.S. Pat. No. 4,346,137 discloses an improved high temperature fatigue resistance NiCo CrAlY coating. U.S. Pat. No. 4,419,416, U.S. Pat. No. 4,585,481, RE-32,121 and U.S. Pat. No. 4,743,514 describe MCrAlY coatings containing Si and Hf. U.S. Pat. No. 4,313,760 discloses a superalloy coating composition with good oxidation, corrosion and fatigue resistance.

In contrast to the $\gamma/\beta$-coatings, the $\gamma/\gamma'$-type of MCrAlY coatings, known e.g. from U.S. Pat. No. 4,973,445, are relatively new. The unique feature of this type of $\gamma/\gamma'$-coatings is that their thermal expansion mismatch is close to zero in combination with a high ductility, what make these coatings more resistant to thermal fatigue. However the limitations are the low aluminum content and hence their low reservoir of aluminum.

Furthermore, U.S. Pat. No. 4,758,480 discloses a class of coatings whose composition is based on the composition of the underlying substrate. The similarity in phase structure and in the chemical composition renders the mechanical properties of the coating similar to those of the substrate thereby reducing thermomechanically-reduced damage during service. However, when this coating is applied by traditional means on the single crystal substrate, the difference in the E-modulus between <010> oriented surface layer of the substrate and randomly oriented coating grains produce high TMF damage.

U.S. Pat. No. 5,232,789 discloses the further improvement of the TMF properties of the coating-substrate system. The coating, which has composition and phase structure similar to the substrate alloy, has at least 1000 times more fine-grained structure, produced by a special technology. The lowermost interface portion of the fine-grained coating grows epitaxially, and therefore has the same crystal orientation as the substrate. Epitaxial growth solves also coating/substrate interface adhesion problem.

However, the system of a single crystal substrate and the multicrystal coating still has a large difference in the mechanical behavior between the substrate and the coating as any equiaxed structure possesses E-modulus much higher than those for single crystal material in <001> direction. Higher E-modulus reflects in lower TMF life of the coating compared to the substrate (although the stresses on substrate-coating interface are significantly reduced compared to the traditional coating-substrate system). Multiple grain boundaries drastically reduce the creep resistance of the fine-grain coating, which finally determines life of the entire blading system.

Therefore, in general, U.S. Pat. No. 6,024,792 is disclosing a method for producing monocrystalline structures on substrates with monocrystalline structures by using an energy beam of high energy from an energy source. The material which is to be introduced into the monocrystalline structure is supplied to the melted region of the substrate. The supplied material is completely melted. An similar method is known from EP-A1-740 977.

More special, EP-A1-1 001 055 is disclosing a MCrAlY-coating and a method of depositing the coating, whereby the coating is epitaxially on the base material and the coating is grown with a single crystal structure. The coating is applied by laser cladding. It was found, in fact, that it was difficult to grown a defect free epitaxial coating with the mentioned $\gamma$(gamma)/$\gamma'$(gamma prime) forming coating material within this document. When using other commercially available highly oxidation resistant alloys for the laser cladding process, the single crystal microstructure can not be maintained. Hot tearing cracks and the breakdown of single crystal solidification occur in the cladded structure, which results in the formation of undesirable equiaxed grains.

SUMMARY OF THE INVENTION

It is object of the present invention to find a method of depositing a $\gamma/\beta$-MCrAlY-coating and to determine in detail the parameter of a defect and crack free coating material, which is epitaxial with the base material, and, in addition, the parameter of the method of depositing. The epitaxial coating is grown on the single crystal substrate, which means that it has the same crystallographic orientation as the substrate.

According to the invention, a method of depositing a bond MCrAlY-coating was found, wherein the MCrAlY-coating material is melted on the surface of the article and epitaxially solidified and wherein the MCrAlY is composed in a way that during solidification of the applied MCrAlY-coating material first a $\gamma$(gamma)-phase is solidified and, subsequently, a $\beta$(beta)-phase.

According to the invention, a bond MCrAlY-coating was found, wherein the MCrAlY has a $\gamma/\beta$-phase. The composition of MCrAlY is made in a way that during solidification of the applied MCrAlY-coating material first a γ(gamma)-phase precipitates and, subsequently, the β(beta)-phase.

Advantageous, the MCrAlY-coating has a solidification interval $\Delta T_0$ of smaller than 30° C., whereby it has to have a temperature interval $\Delta T_1$ of the last 5% liquid of smaller than 15° C. Both factors, determine the width of the mushy zone, the narrower the mushy zone the lower is the susceptibility for hot tearing during the cladding process. Narrow mushy zone means that little inter-dendritic liquid is subjected to shrinkage stresses during the process.

The chemical composition of the new coating should be as close as possible to the eutectic line of the γ and β-phase, on the γ-phase side of the eutectic line of the phase diagram nickel-aluminum-chromium ternary. When the chemical composition of the coating is close to the eutectic line, the change in the chemical composition of the residual liquid during the solidification process will be minor resulting in a crack-free and single crystal cladding.

As an example, the coating has the following composition (wt.-%) 15–30% Cr, 5.0–10% Al, 0.1–1.2% Si, 0.4–1.2 Y, 0–0.1 Hf, 0.1–1.2 Ta, Balance Ni or Co with $\Sigma(Al+Si)<11.5$ wt.-%, $\Sigma(Si+Ta)<2.5$ wt.-%, $\Sigma(Y+Hf+Zr+La)<1.5$ wt.-%, C: max. 0.03 wt.-%, Ca: 0–1 wt.-% and Mg: 0-1 wt.-%.

According to the invention and to obtain a small solidification interval the coating comprises an addition of (wt.-%) Si<1.0%, Hf<0.5%, Y<0.5%, Ta<3% and Zr<0.3%, individually or a combination thereof. For increased oxidation resistance the coating will comprise an addition of Fe, Ga, Mg, Ca, individually or a combination thereof.

In an advantageous embodiment, the MCrAlY-coating is applied by laser cladding with a thickness of 100 to 300 μm and the article is a gas turbine component made a from nickel base super alloy.

BRIEF DESCRIPTION OF DRAWINGS

The patent or application file contains at least one drawing executed in color. Copies of this patent or patent application publication with color drawing(s) will be provided by the Office upon request and payment of the necessary fee.

This invention is illustrated in the accompanying drawing, in which.

The drawings show only parts important for the invention.

DETAILED DESCRIPTION OF INVENTION

Figure 1:
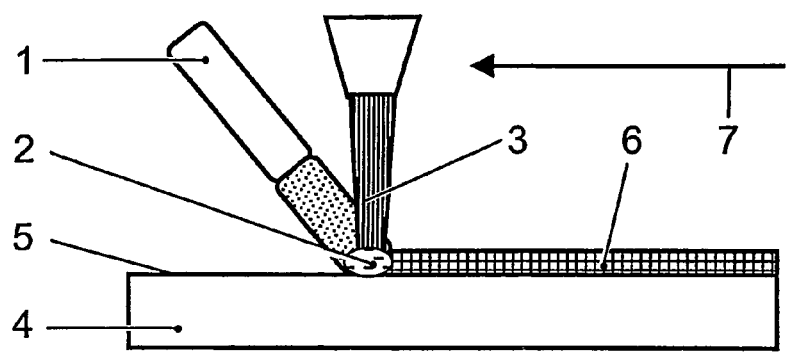
FIG. 1 shows a schematic representation of a laser cladding process

This invention is related to a method of epitaxially growing a MCrAlY-coating 6 having a γ/β-microstructure onto a surface 5 of an article 4 such as blades or vanes of gas turbines or any other part which is exposed to a hot temperature environment. The article 4 has a single crystal (SX) structure and can be made, as an example, from a nickel base super-alloy. Nickel base superalloys are known in the state of the art, e.g. from the document U.S. Pat. No. 5,888,451, U.S. Pat. No. 5,759,301 or from U.S. Pat. No. 4,643,782, which is known as "CMSX-4". In general, FIG. 1 shows a laser cladding process which is characterized by impinging particles of the MCrAlY-coating material with a powder jet 1 onto a molten pool 2 formed by controlled laser heating by scanning the laser beam 3 successively over the surface 5 of the single crystal article 4. The arrow 7 shows the direction of the movement over the article 4.

The laser cladding technology has been used to apply an epitaxial MCrAlY-coating 6 with 100–300 μm thickness on the single crystal superalloy article 4. The coating 6 has a γ/β-structure and is epitaxially grown on the article 4, which means that it has the same crystal orientation as the article 4.

According to the invention during solidification of the melted MCrAlY-coating 6 onto a surface 5 of an article 4 due to the composition of the MCrAlY-coating first a γ(gamma)-phase is solidified and, subsequently, a β(beta)-phase. The γ or γ'-phases within MCrAlY coatings and in superalloy base materials are face-cubic centered (fcc) structured. A β phase is, in contradiction, base-cubic centered (bcc) structured, i.e. there is a lattice mismatch between the γ and the β phase. When the β phase is growing onto the γ substrate this crystal structure difference prevents an epitaxial growth of the MCrAlY crystal. Nucleation of the β phase and growth of randomly oriented grains occur. The crystallographic orientation, and structure, of the substrate is not reproduced in the clad. When the β phase is the second phase to solidify, which means the β-phase is solidifying in the interdendritc areas, primary γ dendrites developed epitaxially with the substrate. Nucleation is avoided and the fcc structure of the substrate is propagated into the clad, by columnar growth of γ dendrites. The crystallographic orientation, and structure, of the substrate is reproduced in the clad.

Furthermore, it has be found that the solidification interval $\Delta T_0$ is a critical parameter for a successful crack-free growth of the MCrAlY-coating 6 having the γ/β-structure. The solidification interval $\Delta T_0$ of the coating 6 must be narrow, e.g. smaller than 30° C., to avoid high risk of hot tearing formation.

Therefore the chemical composition of the new coating 6 should be close to the eutectic line of the γ and β-phase, on the γ-phase side of the eutectic line of the ternary phase diagram nickel-aluminum-chromium. When the chemical composition of the coating is close to the eutectic line, the change in the chemical composition of the residual liquid during the solidification process will be minor resulting in a crack-free and single crystal cladding.

Due to facts mentioned above the coating has a very low susceptibility for hot tearing during solidification. Thus, the coating is crack free. Subsequently, the cladding of the γ/β-coating gives a higher flexibility in the laser process parameters such as cladding speed and laser power, which leads in an increased process window.

A γ/β-MCrAlY-coating 6 according to the invention has the following preferred range of (wt.-%): 15–30% Cr, 5.0–10% Al, 0.1–1.2% Si, 0.4–1.2 Y, 0–0.1 Hf, 0.1–1.2 Ta, balance Ni or Co and unavoidable impurities with X (Al+Si)<11.5%, $\Sigma(Si+Ta)<2.5\%$, $\Sigma(Y+Hf+Zr+La)<1.5\%$, C max. 0.03%, Ca: 0–1% and Mg: 0–1%.

In an advantageous embodiment the concentration of minor elements in the coating, i.e. Y, Hf, Si, Zr and Ta must be adjusted to design the solidification behavior of the coating alloy. Some of those elements widen the solidification interval e.g. Si. This results in the formation of interdentric liquid with low solidus temperature phases leading to hot tearing phenomena (solidification cracking). The concentration of the minor elements such as Y, Zr and Ta must be adjusted to avoid formation of brittle phases containing these elements and sensitive to cracking under residual stresses produced during cooling after solidification. Thus, according to the invention and to obtain a small solidification interval, the following conditions have to be fulfilled (wt.-%) Si<1.0%, Hf<0.5%, Y<0.5%, Ta<3% and Zr<0.3%.

Another important factor is that the last 5% liquid must be smaller than 15° C. Both factors, the small solidification interval and the temperature interval $\Delta T_1$ of the last 5% liquid determine the width of the mushy zone, the narrower the mushy zone the lower is the susceptibility for hot tearing during the cladding process. Narrow mushy zone means that little interdendritic liquid is subjected to shrinkage stresses during the process.

The coating 6 may contain the elements Si, Hf and Zr and a small addition of Ta, Fe, Ga, Mg, Ca individually or a combination thereof as well for increased oxidation resistance.

TABLE 1

Examples for the coating according to the invention is shown in table 1 (wt.-%)

| Example | Ni | Co | Cr | Al | Re | Ta | Si | Y | $\Delta T_0$ [° C.] |
|---------|------|----|----|------|----|-----|-----|-----|-----|
| I | Bal. | 24 | 12 | 11.5 | 3 | 0.5 | 1.2 | 0.5 | 100 |
| II | Bal. | 36 | 22 | 10 | — | — | — | 1 | 80 |
| III | Bal. | 40 | 23 | 8 | — | 1 | 0.5 | 0.4 | 25 |

The $\Delta T_0$ of Coating I, II and III respectively are 100° C., 80° C. and 25° C., The coating I could not be grown epitaxially due to the fact the here beta phase appears first and, thus, an equiaxed structure is formed. The coating II also behaved similarly. In according to the invention the coating III could be grown defect free and epitaxially.

On the other hand, the laser parameters, e.g. laser power, scanning speed, protection gas are optimized and balanced against each other for the deposition of the single crystal MCrAlY coating 6 onto a single crystal base material. The alloys design of the newly MCrAlY coatings enables the maintenance and growth of the SX coating.

Figure 2:
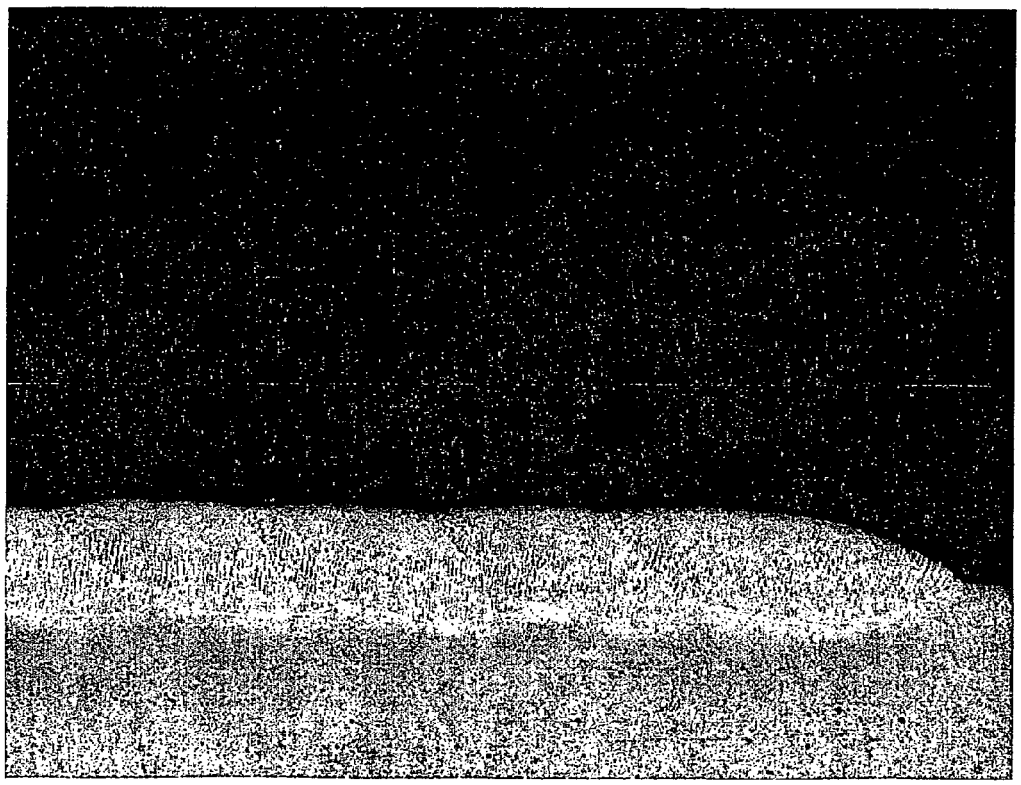
FIG. 2 shows an example of an epitaxially γ/β-MCrAlY-coating according to the invention and FIG. 3 shows an example of a non epitaxially γ/β-MCrAlY-coating.

The Example of FIG. 2 shows a workpiece as a result of a coating from this invention with a fully SX-structure and no cracks. The conditions of the annexed claims have been fulfilled. The very even and parallel dendrite structure indicate the SX structure of the clad, this has been also proven with the Electron Back Scattering Diffraction (EBSD) Kikuchi technique.

Figure 3:
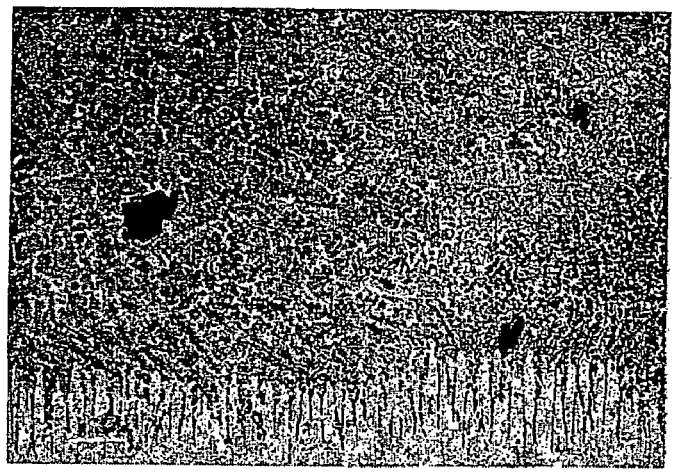

In contradiction, FIG. 3 shows an example of a non-epitaxially nucleation at the CMSX-4 substrate with a coating according example I in table 1. It shows an alloy, where β phase is the first phase to solidify. The bright dendrites which are visible is the re-melted base material. Although cladded with optimized laser parameters the coating material was very difficult to apply. Outside of the range of the conditions of the claims it is very susceptible to hot tearing and breakdown of single crystal structure.

REFERENCE NUMBERS

1 powder jet
2 molten pool
3 laser beam
4 article
5 surface of article 4
6 coating
7 direction of movement $\Delta T_0$ Solidification interval of coating 6
$\Delta T_1$ Solidification interval of the last 5% of liquid of the coating 6

What is claimed is:

1. A method of epitaxially growing a MCrAlY-coating onto a surface of an article, the article having a single crystal structure, wherein the MCrAlY-coating has a γ/β-structure and the coating material is melted on the surface of the article and epitaxially solidified and wherein the MCrAlY is composed in a way that during solidification of the applied MCrAlY-coating material first a γ(gamma)-phase is solidified and, subsequently, a β(beta)-phase.

2. The method according to claim 1, wherein the MCrAlY-coating solidifies in a solidification interval ($\Delta T_0$) of smaller than 30° C.

3. The method according to claim 1, wherein the last 5% of the MCrAlY-coating liquid solidifies in a temperature interval smaller than 15° C.

4. The method according to claim 1, wherein the MCrAlY-coating is applied by laser cladding.

5. An article having a surface and a single crystal structure, the article coated with protective MCrAlY-coating, which MCrAlY is epitaxially grown on the surface of the article, wherein the MCrAlY has a γ/β-structure.

6. The article according to claim 5, wherein the composition of MCrAlY is made in a way that during solidification of the applied MCrAlY-coating material first a γ(gamma)-phase precipitates and, subsequently, the β(beta)-phase.

7. The article according to claim 5, wherein the MCrAlY-coating has a solidification interval ($\Delta T_0$) of smaller than 30° C.

8. The article according to claim 5, wherein the MCrAlY-coating has a temperature interval ($\Delta T_1$) of the last 5% liquid of smaller than 15° C.

9. The article according to claim 5, wherein the chemical composition of the new coating is be close to the eutectic line of the γ and β-phase, on the γ-phase side of the eutectic line of the phase diagram nickel-aluminum-chromium ternary.

10. The article according to claim 5, wherein the MCrAlY-coating has a thickness of 100 to 300 μm.

11. The article according to claim 5, wherein the MCrAlY-coating is applied by laser cladding.

12. The article according to claim 5, wherein the MCrAlY-coating is crack free.

13. The article according to claim 5, wherein the coating has the following composition (wt.-%) 15–30% Cr, 5.0–10% Al, 0.1–1.2% Si, 0.4–1.2 Y, 0–0.1 Hf, 0.1–1.2 Ta, balance Ni or Co and unavoidable impurities with Σ(Al+Si)<11.5%, Σ(Si+Ta)<2.5%, Σ(Y+Hf+Zr+La)<1.5%, C max. 0.03%, Ca: 0–1% and Mg: 0–1%.

14. The article according to claim 5, wherein the coating comprises an addition of (wt.-%) Si<1.0%, Hf<0.5%, Y<0.5%, Ta<3% and Zr<0.3%, individually or in a combination thereof.

15. The article according to claim 5, wherein the coating comprises an addition of Fe, Ga, Mg, Ca individually or in a combination thereof, the addition being an effective amount to increase the oxidation resistance of the article.

16. The article according to claim 5, which is a gas turbine component made from nickel base super alloy.

* * * * *